United States Patent [19]

Raver

[11] Patent Number: 4,626,705
[45] Date of Patent: Dec. 2, 1986

[54] FIELD EFFECT TRANSISTOR TIMING SIGNAL GENERATOR CIRCUIT

[75] Inventor: Norman Raver, Yorktown Heights, N.Y.

[73] Assignee: International Business Machines Corporation, Armonk, N.Y.

[21] Appl. No.: 620,765

[22] Filed: Jun. 14, 1984

[51] Int. Cl.[4] .................................... H03K 17/14
[52] U.S. Cl. ........................ 307/269; 307/263; 307/265; 307/246; 307/494; 307/591
[58] Field of Search ............... 307/262, 263, 265, 269, 307/570, 571, 246, 268, 252, 305, 491, 494, 591, 594, 597, 601, 603, 605; 328/58; 329/104; 363/26, 41; 318/599

[56] References Cited

U.S. PATENT DOCUMENTS

| | | | |
|---|---|---|---|
| 3,935,475 | 1/1976 | Margolies | 307/208 |
| 3,969,719 | 7/1976 | Sirocka et al. | 340/336 |
| 4,004,162 | 1/1977 | Kato et al. | 307/269 |
| 4,072,932 | 2/1978 | Kitagawa et al. | 365/233 |
| 4,449,059 | 5/1984 | Dickes | 307/265 |

*Primary Examiner*—Stanley D. Miller
*Assistant Examiner*—D. R. Hudspeth

*Attorney, Agent, or Firm*—John J. Goodwin

[57] ABSTRACT

A circuit for generating accurate timing pulses which includes a timer means, a reference and feedback amplifier means, a feedback difference amplifier means, a difference amplifier means and a pulse shaper means. The timer means includes a constant current source which is triggered on by the input waveform signal and produces current $i_c$. Reference and feedback amplifier means generates a voltage $V_{ref}$ which is proportional to current $i_c$. Thus, if $i_c$ is too high or too low, $V_{ref}$ will represent the error value. The d.c. reference signal $V_{ref}$ is applied to the feedback difference amplifier means which is a typical dynamic detector circuit. Feedback difference amplifier circuit is triggered and changes state when the voltage of the constant current timing circuit (which is proportional to $i_c$) equals the reference voltage $V_{ref}$. The output signal from feedback difference amplifier means is applied to the straightforward difference amplifier means for further amplification. The amplified output voltage signal is then applied to a pulse shaper circuit means along with the original input signal such that the timing of the input signal is adjusted in accordance with the signal from the difference amplifier to produce an output timing pulse.

3 Claims, 3 Drawing Figures

FIELD EFFECT TRANSISTOR TIMING SIGNAL GENERATOR CIRCUIT

BACKGROUND OF THE INVENTION

1. Field of the Invention

The present invention relates to a circuit for generating accurate timing signals for computer clocking, and more particularly to a circuit including field effect transistor (FET) devices for producing accurate timing pulses.

2. Description of the Prior Art

The prior art contains numerous references describing circuits of various types for providing timing signals or pulses. For example, U.S. Pat. No. 3,969,719 issued July 13, 1976 to Sirocka et al entitled ELECTRONIC WATCH shows a circuit including an oscillator which produces reference pulses which are divided down and then applied to level converters and shaper circuits.

U.S. Pat. No. 3,935,475 issued Jan. 27, 1976 to Margolies entitled TWO-PHASE MOS SYNCHRONIZER describes an input circuit to a clock pulse circuit which includes an FET logic circuit and an output circuit which includes an inverter in series with an FET.

U.S. Pat. No. 4,072,932 issued Feb. 7, 1978 to Kitagawa et al entitled CLOCK GENERATOR FOR SEMICONDUCTOR MEMORY describes a timing generator circuit including a differential read clock generator consisting of an FET bistable amplifier and a differential voltage sensor.

The prior art does not teach an FET clock generating circuit including a constant current timing circuit which feeds a reference and feedback amplifier, an output of which is connected to a feedback difference amplifier providing an output through a pulse shaper.

SUMMARY OF THE INVENTION

Because of manufacturing processes, FET devices exhibit wide variations in parameters and tolerances, and it is therefore, difficult to utilize them in a clocking circuit where the generation of accurate timing pulses held to vary narrow tolerances is required.

An object of the present invention is to provide a circuit using FET devices which will provide accurate timing pulses.

Another object of the present invention is to provide an FET timing circuit including a constant current source that varies because of device variations and which further includes a reference voltage source which provides a compensating reference voltage that varies in level with the variations in the current source.

Still another object of the present invention is to provide an FET timing circuit structure including a constant current source, a reference and feedback amplifier circuit for generating a varying reference voltage, a feedback difference amplifier for detecting the crossover between the constant current source signal and the reference voltage signal, and a pulse shaping circuit for providing an output timing signal adjusted in accordance with the crossover occurrence time.

The foregoing and other objects, features and advantages of this invention will be apparent from the following more particular description of the invention, as illustrated in the accompanying drawings.

DESCRIPTION

Figure 1:
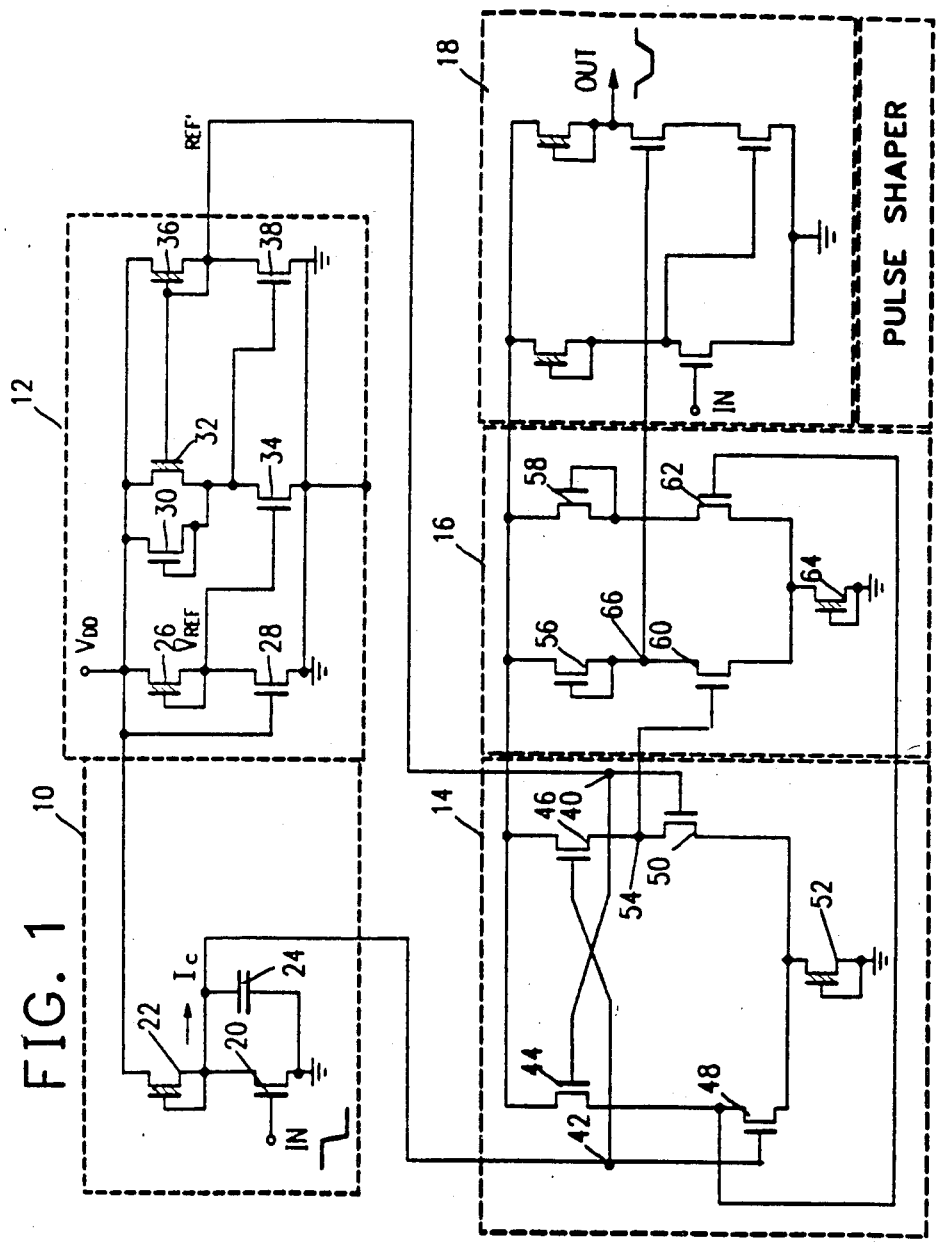
FIG. 1 is a schematic block diagram of a timing signal generator according to the principles of the present invention.

FIG. 1 is a schematic diagram of a circuit for generating accurate timing pulses using FET devices which exhibit considerable parameter spreads as a result of manufacturing processes. The circuit includes a timer means 10, a reference and feedback amplifier means 12, a feedback difference amplifier means 14, a difference amplifier means 16 and a pulse shaper means 18.

Figure 3:
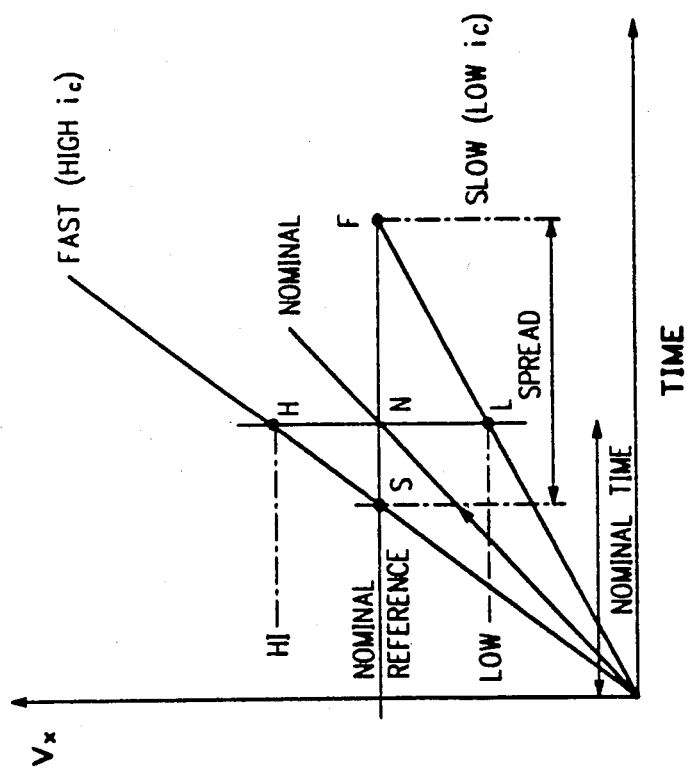
FIG. 3 is a waveform of voltage vs time useful in explaining the operation of the circuit of FIG. 1.
Figure 2:
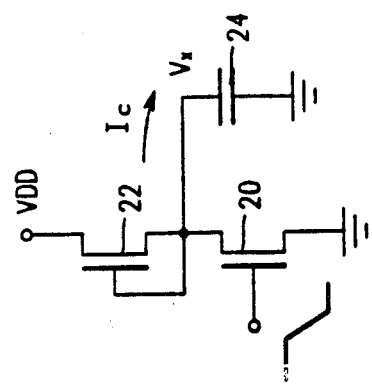
FIG. 2 is a schematic illustration of the constant current timer portion of the circuit of FIG. 1.

Timer means 10 includes an input transistor 20 connected to and triggered by a negative going waveform input signal. A depletion device 22 is connected between potential source $V_{DD}$ and transistor 20. This forms a constant current source which is triggered on by the input waveform signal and produces current $i_c$. The current $i_c$ is applied to and charges capacitor 24 until a preset level is reached. For example, FIG. 2 illustrates the current $i_c$ charging capacitor 24 to provide a voltage $V_x$ across capacitor 24. FIG. 3 illustrates the time for charging capacitor 24 to given levels of $V_x$. In a nominal time, capacitor 24 should charge to $V_x = N$ for a nominal current $i_c$. However, because of device manufacturing spreads, the current $i_c$ will vary, and for a spread as illustrated in FIG. 3, a low value of $i_c$ will charge capacitor 24 slowly such that $V_x$ will only be equal L after the nominal time period and it will take until time F for $V_x$ to reach the voltage line N. Likewise, a high value of $i_c$ will charge capacitor 24 rapidly such that $V_x$ will equal N at time S prior to the nominal time period and $V_x$ will continue to increase and be as high as H after the nominal time period has elapsed. This variation is compensated for in the present invention by varying a d.c. reference voltage level linearly with the variation of current $i_c$ such that the time at which the voltage $V_x$ across capacitor 24 intersects the reference voltage level is maintained at a nominal constant value. In other words, referring to FIG. 3, the nominal time as measured to the line H-N-L should be maintained. Therefore, for large values of $i_c$ (i.e., FAST), the d.c. reference voltage should be set high to intersect $i_c$ at point H on the same nominal time value line H-N-L whereas for smaller values of $i_c$ (i.e., SLOW) the d.c. reference voltage level should be set low to intersect $i_c$ at point L on the same nominal time value line H-N-L.

Thus, as variations in the value of $i_c$ occur as a result of FET parameter spreads, a d.c. reference voltage $V_{ref}$, will be generated to linearly vary with the changes in $i_c$ in order to maintain accurate (constant) timing. The varying reference voltage $V_{ref}$ is generated by reference and feedback amplifier means 12.

Reference and feedback amplifier means 12 includes a pair of transistors 26 and 28. Transistors 26 and 28 are connected between $V_{DD}$ and ground. Transistor 26 is electrically the same as transistor 22 which generates current $i_c$, and the voltage $V_{ref}$ between transistors 26 and 28 is proportional to the current flowing through transistor 26. Thus, the voltage $V_{ref}$ is proportional to current $i_c$. Thus, if $i_c$ is high as shown in FIG. 3, $V_{ref}$ will represent the error value H-N, whereas if $i_c$ is low, $V_{ref}$ will represent the error value N-L. The other five transistors 30, 32, 34, 36 and 38 of means 12 form a feedback amplifier to amplify $V_{ref}$ to a suitable value and provide stable gain and produces output d.c. voltage signal $V_{ref}$.

The d.c. reference signal $V_{ref}$ is applied to the gate of device 50 of feedback difference amplifier means 14. The output voltage signal of $V_x$ from constant current timing circuit 10 is applied to the gate of device 48 of feedback difference amplifier 14 which is a dynamic detector circuit including cross-coupled transistors 44 and 46, transistors 48 and 50 and transistor 52. Feedback difference amplifier circuit 14 is triggered and changes state when the voltage $V_x$ across capacitor 24 of constant current timing circuit 10 (which is proportional to $i_c$) equals the amplified reference voltage $V_{ref}$ (i.e., the crossover point). The output signal from feedback difference amplifier means 14, which is the voltage at node 54 is applied to a straightforward difference amplifier means 16, including transistors 56, 58, 60, 62 and 64, for further amplification. The amplified output voltage signal from node 66 of difference amplifier means 16 is applied to a pulse shaper circuit means 18.

Pulse shaper circuit means 18 includes a pair of depletion devices 68 and 70 and transistors 72, 74 and 76. The same input signal applied to transistor 20 is also applied to the gate of transistor 72 and the output signal of difference amplifier 16 on node 66 is connected to the gate of transistor 76.

Referring now to FIG. 1, the negative going input signal is applied to device 20, capacitor 24 charges in accordance with the rate of $i_c$ and an output voltage is provided from timer circuit 10 that is rising proportional to the rate of rise of $i_c$. It may be faster than nominal or slower than nominal depending on the characteristics of the FET devices used. This rising voltage is appled to one side of difference amplifier 14 at the gate of device 48.

Meanwhile, device 20 of reference and feedback means 12 is connected to device 22 of timer 10 and an error signal $V_{ref}$ proportional to the current $i_c$ is produced which indicates whether $i_c$ is rising faster (H-N) or slower (N-L) then the desired nominal rise. This $V_{ref}$ voltage is amplied and made stable in the feedback amplifier portion of means 12 and a d.c. output voltage $V_{ref}$, is produced which is set high (i.e., at $V_x$=H of FIG. 3) when $i_c$ rises faster than nominal or is set low (i.e., $V_x$=L) when $i_c$ rises slower than nominal. In any case, $V_{ref}$ is set such it is always at the same voltage value of the $V_x$ produced by $i_c$ at the end of the desired nominal time period, that is, for example, the time designated by the H-N-L line. This $V_{ref}$ signal is applied to the other side of the difference amplifier 14 at the gate of device 50.

Difference amplifier 50 will trigger when $V_x$ (due to $i_c$ from timer 10) is equal to the level of $V_{ref}$. The time when these voltages are equal is always the same time. If $V_x$ rises faster than nominal, then the $V_{ref}$ produced is high, if $V_x$ rises slower than nominal then $V_{ref}$ is low such that the two voltages are the same value along, for example, the H-N-L time line of FIG. 3.

Difference amplifier triggers and produces a positive pulse at such time from device 48 and a corresponding negative pulse at this time from device 50 on node 54. Difference amplifier 14 is selected to have a wide input signal range and, therefore, has a low gain. The pulses from devices 48 and 50 are applied to another difference amplifier 16 to merely sharpen the pulse transitions and provide further amplification. Thus a sharp negative going pulse is produced on node 66 which is applied to the base of device 76 of pulse shaper means 18.

The same input negative going input signal applied to device 20 of timer means 10 is applied to the base of device 72 of pulse shaper means 18.

It should be recalled that the negative going pulse at node 66 occurs at the desired nominal time because it is produced when $V_x$ is equal to $V_{ref}$.

The negative going input signal is inverted by device 72 and turns on device 74. When device 74 turns on the output voltage OUT from the pulse shaper means 18 goes low.

Now the predetermined interval occurs corresponding to the signal at node 66 going negative. When the signal at node 66 goes negative, device 76 then goes off and the output voltage OUT goes high, completing the cycle. This provides an accurately timed clock pulse which always occurs at the same time regardless of variations in $i_c$ and $V_x$ due to variations in FET characteristics.

Having thus described my invention, what I claim as new, and desire to secure by Letters Patent is:

1. A clock signal generator for providing an output clock signal adjusted for variations in circuit current comprising:

timer circuit means responsive to an input signal for producing a timing voltage signal having a voltage slope which varies faster or slower than a desired nominal slope due to circuit variations, said timer circuit means including an FET constant current device for producing a varying current $i_c$ in response to said input signal, and a capacitor responsive to said current $i_c$ to produce said timing voltage signal, reference voltage generating means connected to said timer circuit for generating a reference voltage having a magnitude proportional to the difference between said timing voltage slope and said nominal desired slope, wherein said reference voltage generating means includes a voltage source $V_{DD}$ and a pair of transistors connected to Vhd DD for providing a voltage between said pair of tansistors proportional to current $i_c$, and a feedback amplifier to amplify said voltage between said pair of transistors to a suitable value and provide stable gain to produce said reference voltage signal, detecting means connected to said timer circuit means and said reference voltage generating means for producing a pulse signal representative of the crossover time when said magnitude of said timing voltage signal is equal to the magnitude of said reference voltage, wherein said reference voltage is set higher for timing voltage pulse slopes which vary faster than said nominal slope, and is set lower for timing voltage pulse slopes which vary slower than said nominal slope such that said crossover time when said magnitudes are equal always occurs at the same given time period after the beginning of said timing voltage pulse, and a waveform shaping means connected to said input signal and to said timing voltage signal for producing an output clock pulse having an occurrence time determined by said timing voltage signal and said crossover time.

2. A clock signal generator according to claim 1 wherein said detecting means is a feedback difference amplifier including first and second switching transistors and wherein said reference voltage signal from said reference voltage generating means is said first switching transistor and said timing voltage signal from said timer circuit means is applied to said second transistor circuit, said feedback difference amplifier being triggered and producing an output pulse when said timing voltage signal equals said reference voltage.

3. A clock signal generator according to claim 2 wherein said waveform shaping means includes first and second output transistor means, said first output transistor means connected to and being turned on by the output pulse of said feedback difference amplifier, and said second output transistor means connected to and being turned on by said input signal to produce a output clock pulse when both said first and second output transistors are turned on.

* * * * *